United States Patent [19]

Hoover

[11] 4,159,450
[45] Jun. 26, 1979

[54] COMPLEMENTARY-FET DRIVER CIRCUITRY FOR PUSH-PULL CLASS B TRANSISTOR AMPLIFIERS

[75] Inventor: Merle V. Hoover, Flemington, N.J.

[73] Assignee: RCA Corporation, New York, N.Y.

[21] Appl. No.: 908,514

[22] Filed: May 22, 1978

[51] Int. Cl.² .................. H03F 3/185; H03F 3/26
[52] U.S. Cl. ................... 330/264; 330/265; 330/268; 330/300
[58] Field of Search ............ 330/264, 265, 267, 268, 330/269, 277, 300; 307/205

[56] References Cited

U.S. PATENT DOCUMENTS

| | | | |
|---|---|---|---|
| 3,872,390 | 3/1975 | Nash | 330/264 |
| 3,886,464 | 5/1975 | Dingwall | 330/269 |
| 3,986,134 | 10/1976 | Yokoyama | 330/269 |
| 4,000,474 | 12/1976 | Todokoro | 330/264 |
| 4,021,751 | 5/1977 | Suzuki | 330/264 X |
| 4,031,482 | 6/1977 | Tsurushima | 330/264 |
| 4,032,864 | 6/1977 | Yamashiro et al. | 330/277 X |

*Primary Examiner*—James B. Mullins
*Attorney, Agent, or Firm*—H. Christoffersen; A. L. Limberg; E. P. Herrmann

[57] ABSTRACT

A complementary or quasi-complementary Class B transistor amplifier stage, the halves of which have their output circuits serially connected between relatively negative and relatively positive operating supply voltages to receive direct current and are operated in push-pull with each other for signal to supply a common load from the interconnection of their output circuits, has driver circuitry including a pair of field effect transistors operated in push-pull to supply respective halves of the Class B transistor amplifier. A p-channel field effect transistor with source electrode connected to the relatively positive operating supply voltage drives one half of the Class B transistor amplifier stage from its drain electrode, and an n-channel field effect transistor with source electrode connected to the relatively negative operating supply voltage drives the other half of the Class B transistor amplifier stage. The field effect transistors in the driver circuitry are enhancement-mode types permitting their gate electrodes to be connected together to receive input signal potential, avoiding the need for voltage translating circuitry to secure their push-pull operation.

23 Claims, 7 Drawing Figures

COMPLEMENTARY-FET DRIVER CIRCUITRY FOR PUSH-PULL CLASS B TRANSISTOR AMPLIFIERS

The present invention relates to push-pull Class B transistor amplifiers, of complementary or quasi-complementary type, provided with push-pull driver circuitry.

It is customary to operate the output stages of monolithic integrated circuit amplifiers in Class B push-pull, to reduce the standby power consumption and minimize dissipation for zero—and small—signal operation, while the driver circuitry is operated Class A push-pull, to achieve maximum linearity at the expense of quiescent currents in the driver stage of the same magnitudes as the expected peak signal currents. The halves of the Class B transistor amplifier stage have their output circuits serially connected between relatively negative and relatively positive operating supply voltages to receive direct current, and are operated in push-pull with each other to supply a common load from the interconnection between their output circuits. It is desirable that the push-pull driver circuitry be capable of providing drive signals over the operating voltage range afforded between these relatively negative and relatively positive operating supply voltages.

In the prior art, rather complex voltage translating circuitry has been necessary to provide the desired push-pull drive signals in response to an input signal voltage, particularly where it is desired to apply the input signal voltage at a quiescent level midway between the relatively negative and relatively positive operating supply voltages. This mode of input signal application is particularly desirable inasmuch as it facilitates direct-coupled feedback arrangements from the output of the Class B push-pull transistor amplifier stage to the input of the preceding push-pull driver amplifier stage.

The present inventor has found that these problems can be overcome through the use of complementary conductivity field effect transistors (FET's) in a push-pull driver stage. The present invention is embodied in an amplifier of the following type or its like. A p-channel FET with source electrode connected to the relatively positive operating supply voltage acts as a current source means to drive the upper half of the Class B push-pull transistor amplifier stage—i.e., the half with its output circuit most directly connected to the relatively positive operating voltage—and can bring its input circuit clear to the relatively positive voltage as applied to the source electrode of the p-channel FET to provide maximum positive output voltage swing from the Class B transistor amplifier stage. An n-channel FET with source electrode connected to the relatively negative operating supply voltage acts as a current sink means to drive the lower half of the Class B push-pull transistor amplifier stage—i.e., the half with its output circuit most directly connected to the relatively negative operating supply voltage—and can bring its input circuit clear to the relatively negative voltage applied to the source electrode of the n-channel FET to provide maximum negative output voltage swing from the Class B transistor amplifier stage. At the same time the gate electrodes of the FET's are simply connected to the same input signal terminal either directly or by simple potential offsetting means.

Figure 1:
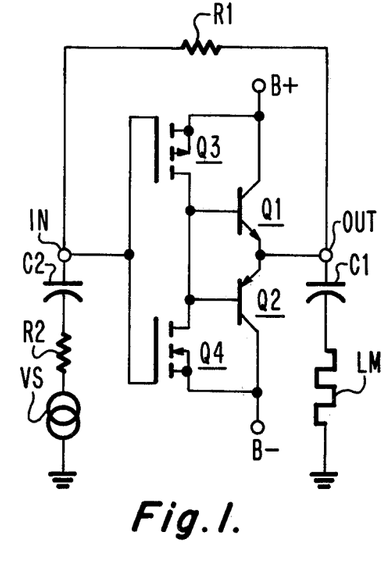
FIGS. 1–7 are schematic diagrams of representative amplifiers embodying the present invention.

The FIG. 1 Class B amplifier circuit has an output stage comprising common-collector amplifier transistors Q1 and Q2, the collector electrodes of which respectively connect to a relatively positive operating supply potential B+ and to a relatively negative operating supply potential B−. Q1 and Q2, which are respectively NPN and PNP in type, have their respective emitter electrodes connected to an output signal terminal OUT, which connections may, as shown, be direct connections without substantial intervening impedance or may, in accordance with common practice, include respective emitter resistances. Q1 and Q2 are connected at their base electrodes so they may not be simultaneously conductive, arranging them for Class B operation. The common-emitter forward current gains of Q1 and Q2 are $h_{feQ1}$ and $h_{feQ2}$, respectively. Positive currents applied to the interconnected base electrodes of Q1 and Q2 will flow as base current to Q1, conditioning Q1 to supply positive emitter currents larger by a factor $(h_{feQ1}+1)$ from terminal OUT; and negative currents applied to the interconnected base electrodes of Q1 and Q2 will flow as base current to Q2, conditioning Q2 to supply negative emitter currents larger by a factor $(h_{feQ2}+1)$ from terminal OUT. These output signal currents supplied from the emitter electrodes of Q1 and Q2 via terminal OUT typically are coupled via a coupling capacitor C1 to a load means LM, although one may also arrange for direct coupling of terminal OUT to a load means, as well-known.

The current applied to the interconnected base electrodes of Q1 and Q2 is the sum of the oppositely directed drain currents of a p-channel field effect transistor Q3 and an n-channel field effect transistor Q4. The gate electrodes of Q3 and Q4 are directly connected to an input signal terminal IN, while their source electrodes are connected to B+ and B− operating supply voltages, respectively, arranging them for operation as common-source amplifiers. The quiescent drain currents of Q3 and Q4 depend upon the potential between their source electrodes, the degree to which they are enhancement- or depletion-mode devices and their channel dimensions. By making Q3 and Q4 enhancement-mode devices one is able to use devices with smaller channel dimensions and reduce the area they take up on a semiconductor die, particularly if the potential between their source electrodes exceeds a few volts, where one wishes to limit the maximum drive currents available to the base electrodes of bipolar output transistors Q1 and Q2.

The gate-to-gate and drain-to-drain connections of common-source amplifier transistors forms an inverter stage known from the prior art to be operable as a linear amplifier providing there is a direct-coupled feedback connection from the drain-to-drain connection at its output to the gate-to-gate connection at its input. Feedback connections comprising a resistive element, a transmission gate, an emitter follower, or a cascaded pair of further inverter stages are known to the prior art.

In the present invention the feedback connection from the drain-to-drain connection of Q3 and Q4 to their gate-to-gate connection is a quasi-linear feedback connection including the inverse-parallel connection of the base-emitter junctions of Q1 and Q2 and means, exemplified by R1, for direct-coupling terminal OUT to terminal IN. This feedback arrangement also provides for overall linearizing feedback to the FIG. 1 amplifier to reduce the effects of cross-over distortion in the Class B amplifier connection of Q1 and Q2. The drains of Q3 and Q4 provide drive to the interconnected base electrodes of Q1 and Q2 that is current-mode, rather than voltage-mode, in nature. That is the current, rather than the voltage, supplied to the interconnected base electrodes of Q1 and Q2 from the interconnected drain electrodes of Q3 and Q4 tends to be proportional to the input signal voltage supplied from an input signal voltage VS, which is connected to the interconnected gate electrodes of Q1 and Q2 through resistor R2 and coupling capacitor C2.

In the cross-over region, where prior conduction of one of the transistors Q1 and Q2 has been terminated without the other transistor having been placed into conduction, the feedback connection from the interconnected drain electrodes of Q3 and Q4 to their interconnected gate electrodes is in substantial effect opened. This tends to stop the counter-action to input signal current flow from source VS through R2 and C2 to the terminal IN, that would be afforded by feedback current flow through R1 responsive to output signal swing. Except for the effect of stray capacitance, this tends to make a step discontinuity in the voltages at terminal IN and at the interconnected base electrodes of Q1 and Q2 to carry one through the cross-over region as input signal potential from VS swings through its average-axis value.

Under quiescent conditions, if the drain currents of Q3 and Q4 are equal—which occurs for their gate voltages and their drain voltages being exactly midway between the B+ and B− operating potentials assuming the drain current ($I_D$) versus source-to-gate voltage ($V_{GS}$) responses of Q3 and Q4 to be equal and complementary, as is the ideal—no base current flows to either of transistors Q1 and Q2. The feedback connection from the interconnected drain electrodes of Q3 and Q4 to their interconnected gate electrodes is open-circuited, and the drain and gate voltages of Q3 and Q4 are not corrected.

If the drain currents of Q3 and Q4 are not equal, the excess drain current of the more conductive one of transistors Q3 and Q4 will flow as base current to the one of the bipolar transistors Q1 and Q2 that is complementary in its conductivity type, i.e., excess drain current from p-channel Q3 flows as base current to NPN Q1, and excess drain current from n-channel Q4 flows as base current to PNP Q2. The conduction of the bipolar transistor shifts the voltage at terminal OUT applied via R1 to terminal IN in such direction as to equalize the drain currents of Q3 and Q4.

Figure 2:
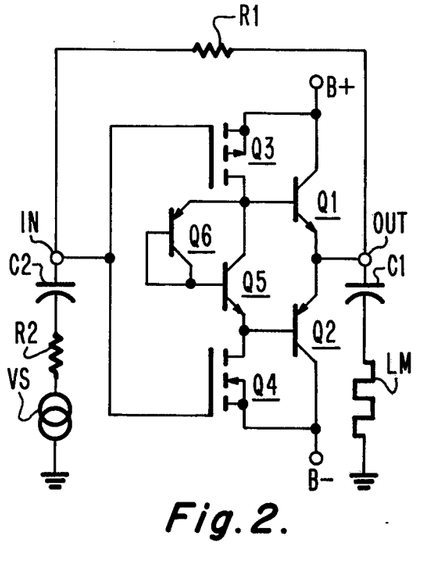

FIG. 2 shows a modification of the FIG. 1 amplifier wherein the substantially impedance-free interconnection between the drain electrodes of Q3 and Q4 is replaced by direct current conductive means that limits the potential offset between the base electrodes of Q1 and Q2 sufficiently to prevent Q1 and Q2 from simultaneous heavy conduction, but permits their simultaneous light conduction so that a quiescent idling current may flow from the B+ to B− terminals of the operating potential supply, via the serially connected collector-to-emitter paths of Q1 and Q2. This direct current conductive means is shown as comprising a shunt regulator NPN transistor Q5 the conduction of which is regulated by its collector-to-base feedback connection via self-biased PNP transistor Q6. Q1 and Q2 are thus conditioned for Class AB operation. Since there is no dead-zone in which neither Q1 or Q2 are non-conductive responsive to signal potential variation at their respective base electrodes, the output signal voltage at output signal terminal OUT exhibits less cross-over distortion than the FIG. 1 amplifier. Distortion in the FIG. 1 configuration is in large part attributable to stray capacitances making it impossible to have instantaneous step-discontinuities in the drain voltages of Q3 and Q4 during cross-overs of conduction from Q1 to Q2 or from Q2 to Q1.

Figure 3:
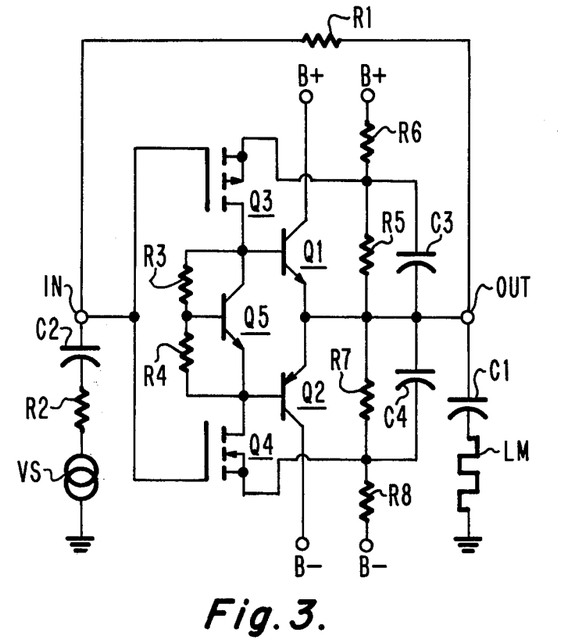

FIG. 3 shows an alternative form of Class AB amplifier in which the conduction of shunt regulator transistor Q5 is regulated by collector-to-base feedback connection via a potential divider formed by the series connection of resistive elements R3 and R4. R3 is made to have a resistance $R_3$ somewhat smaller than the resistance $R_4$ of R4, so the emitter-to-collector potential of Q5 is regulated to a value somewhat less than twice its emitter-to-base voltage. This voltage is sufficiently small that Q1 and Q2 cannot simultaneously be in full conduction, but sufficiently large to maintain a low idling current through both Q1 and Q2 in the absence of input signal voltage from source VS.

The source electrodes of Q3 and Q4 are not returned to the B+ and B− operating voltages, respectively, to which the collector electrodes of Q1 and Q2 respectively connect. Insofar as the quiescent potentials applied to the source electrodes of Q3 and Q4 are concerned, resistors R5, R6, R7 and R8 with respective resistances $R_5$, $R_6$, $R_7 = R_5$, and $R_8 = R_6$ are connected as a resistive potential divider. This potential divider applies a quiescent source potential to Q4 that is between B− and ground potentials and applies a quiescent source potential to Q3 that is between ground and B+ potentials. This permits Q1 and Q2 to swing the terminal OUT over a greater output signal voltage range, so higher output power can be obtained, while keeping the potential between the source electrodes of Q3 and Q4 at a lower value.

By keeping the quiescent potential between the source electrodes smaller, one can use field effect transistors with lower threshold voltages as driver transistors Q3 and Q4, for given quiescent $I_{DS}$ levels in their channels and maximum drive current available to Q1 and Q2. This allows one to make better use of the input signal voltage swing available from source VS. Q3 and Q4 are square law devices, insofar as $I_{DS}$ versus $V_{GS}$ characteristics are concerned, and operation at lower quiescent $V_{GS}$ increases their transconductance. The smaller potential between the source electrodes of Q3 and Q4 also stresses the field effect transistors less and reduces the likelihood of voltage breakdown problems.

Bootstrap capacitors C3 and C4 connect the terminal OUT to the source electrodes of Q3 and Q4, respectively, and have long time constants compared to the period of the longest cycles of signal being amplified. So under changing signal conditions the capacitors tend to hold their respective charges and thus maintain the voltages across them. The source potentials of Q3 and Q4 have respective values, then, of $[V_{OUT} + R_5(B+)/(R_5+R_6)]$ and of $[V_{OUT} + R_7(B-)/R_7+R_8)]$ where $V_{OUT}$ is the output signal. As $V_{OUT}$ approaches B+, the source potential of Q3 swings more positively than B+, so Q3 may continue to drive the base of Q1; and as $V_{OUT}$ approaches B− the source potential of Q4 swings more negatively than B−, so Q4 may continue to drive the base of Q2.

The bootstrap capacitors, of course, furnish positive, or regenerative, feedback. The degree of regeneration is insufficient to cause oscillation or latch up, because the FET's Q3 and Q4 have relatively low transconductances that when multiplied by the base resistances of the bipolar transistors Q1 and Q2, which are equal to their respective ($h_{fe}+1$)'s divided by their relatively high transconductances, result in the common-gate amplifier voltage gains of Q3 and Q4 each being less than unity.

The application of reduced quiescent source potentials to Q3 and Q4 and the bootstrapping of the source potentials to accommodate a wider range of output signal swing can be carried out, of course, in other ways. R5 and R7 can be omitted with the resistances of R6 and R8 being modified to provide suitable voltage drops for the quiescent source current levels desired for Q3 and Q4, as one example. R5, R6, R7 and R8 may be omitted and the source electrodes of Q3 and Q4 respectively connected to positive and negative bias supplies by respective diodes, poled to be forward-biased under quiescent conditions and reverse-biased when the source potential at one of their electrodes is boosted by action of one of the bootstrap capacitors, as a further example. If one be willing to swing the output voltage over a range smaller than that between B− and B+ operating potentials by the base-emitter offset potentials of Q1 and Q2, one may modify the FIG. 3 amplifier by omitting the bootstrap capacitors C3 and C4.

Figure 4:
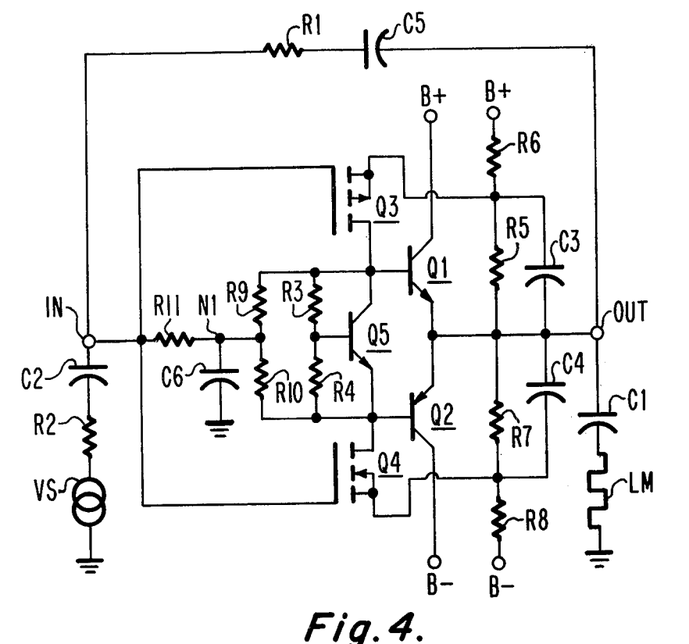

In the amplifier of FIG. 4, the quiescent potential at terminal OUT is not stabilized by direct coupling overall feedback, R1 having a blocking capacitor C5 inserted in series therewith. Rather this potential is determined by direct-coupled feedback around the driver amplifier comprising complementary FET's Q3 and Q4. The drain electrodes of Q3 and Q4 are connected to first ends of equal-resistance resistors R9 and R10, the second ends of which are connected together at node N1. Node N1 is by-passed to signal ground by by-pass capacitor C6 for decoupling the drains of Q3 and Q4 from terminal IN, but permitting a direct potential to be developed at node N1 for application via resistor R11 to the terminal IN. R9, R10 and C6 act to average the quiescent base potentials of Q1 and Q2 for developing the direct potential at node N1, which direct potential will be similar to the quiescent potential provided at terminal OUT by the emitter-follower action of Q1 and Q2. This FIG. 4 biasing arrangement differs from that shown in the FIGS. 1–3 amplifiers in that the current gains of Q1 and Q2 have substantially no effect on the quiescent potential at terminal OUT, reducing the care with which the current gains of transistors Q1 and Q2 have to be matched in order to maintain a full range of output signal potential swing. The by-passing of the direct-coupled drain-to-gate feedback of Q3 and Q4 removes its effect insofar as signal is concerned, so the overall feedback applied via R1 and C1 still provides for Q3 and Q4 supplying current-mode base drive to Q1 and Q2 for optimum signal linearity.

One may alternatively replace R9 and R10 with a single resistor connecting a point on resistor R4, at the midpoint of the potential divider formed by resistors R3 and R4, to node N1. This resistor like R9 and R10 would most conveniently have a relatively high resistance compared to R3 and R4. Other direct-coupled feedback schemes are also possible, as will be apparent to one skilled in the art of amplifier design.

An important advantage of audio amplifiers similar to any of those shown in FIGS 1–4 is that while they employ bipolar transistors as output devices, the bipolar transistors operate only as current amplifiers, with the transconductance characteristics of the amplifiers being determined by their field effect transistor devices. This results in overload distortion on peaks of musical programme material that is less objectionable than that from amplifiers having their transconductance characteristics determined by bipolar transistors, and the amplifiers will provide the type of sound reproduction traditionally associated with vacuum tube amplifiers.

Another advantage of these amplifiers is that, owing to the fact the bipolar output transistors are driven current-mode, these amplifiers have an inherent mechanism for limiting the flow of current when the terminal OUT is short-circuited. One can control the channel dimensions of Q3 and Q4 to limit the amount of base current that can be delivered to either Q1 and Q2; the maximum emitter currents that Q1 and Q2 can then deliver will be larger by ($h_{FeQ1}+1$) and by ($h_{feQ2}+1$), respectively, which factors can be confined to well-defined ranges by selection in the case where Q1 and Q2 are discrete bipolar transistors. Where Q1 and Q2 are integrated transistors, they may each be composite transistor structures having similar current gains—suitable structures, for example, being shown in U.S. Pat. No. 3,863,169 entitled "Composite Transistor Circuit" and issued Jan. 28, 1975 to M. B. Knight. In either case the operation of the output transistors can be confined to their safe operating area ratings (SOAR's), despite short-circuiting of the terminal OUT to ground or to one of the B+ and B− operating voltages. The tendency of the channel resistance of the field effect transistors to increase with temperature rise tends to reduce the base current available to Q1 and Q2, counteracting the tendency of ($h_{feQ1}+1$) and ($h_{feQ2}+1$) to increase with temperatur rise and tending to keep the output current available at terminal OUT more constant with temperature change. This tracking is enhanced in that in each of the push-pull cascade combinations of driver transistor and output transistor (Q3, Q1 and Q4, Q2) one of the devices has its conduction controlled by electron mobility and the other has its conduction controlled by hole mobility, mobility being a temperature-dependent factor influencing transistor gain.

Figure 5:
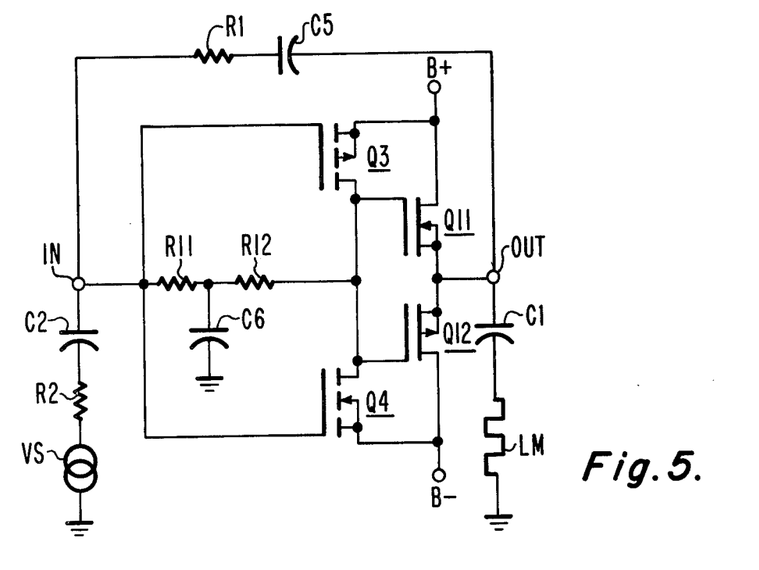

FIG. 5 shows another amplifier embodying the present invention, wherein NPN transistor Q1 and PNP transistor Q2 are replaced by n-channel field effect transistor Q11 and p-channel field effect transistor Q12, respectively. If Q11 and Q12 were enhancement-mode types, the output stage of the FIG. 4 amplifier, like that of the FIG. 1 amplifier, would operate in Class B push-pull. Q11 and Q12 are shown as being depletion-mode types, but are slightly depleted rather than being the more familiar remote cutoff types. Accordingly, their gate-to-gate and source-to-source connections condition Q11 and Q12 for Class AB operation, with them conducting the relatively low idling current under quiescent conditions that is associated with such operation. Class AB operation is achieved without need for elements to maintain an offset potential between the gate electrodes of Q11 and Q12.

The use of field effect transistors as amplifying devices in the output stage of the amplifier rather than bipolar transistors Q1 and Q2 changes the drive provided from the driver stage comprising Q3 and Q4 from current-mode to voltage-mode drive. This is because the gate impedances of the field effect transistors in the output stage and their associated stray capacitance present relatively high-impedance drain loading to each of driver transistors Q3 and Q4 as compared to that presented by the drain impedance of the other driver transistor. The voltage gain of the inverter pair typically ranges from about 600 down to about 30 as their source-to-source potential is increased. This contrasts with the relatively low base impedances offered by bipolar transistors Q1 and Q2 when conductive.

Inasmuch as Q3 and Q4 provide voltage-mode drive to the gates of Q11 and Q12, and inasmuch as with Class AB operation Q11 and Q12 are quiescently conductive to maintain a relationship between their gate and source potentials, direct-coupled drain-to-gate feedback can be provided to Q3 and Q4 by the serially connected resistors R11 and R12 linking the interconnection of their drain electrodes terminal IN, as shown in FIG. 5. Bypass capacitor C6 decouples the drains of Q3 and Q4 from terminal IN insofar as signal is concerned. Where the resistance R2 associated with the source VS of input signal voltage can be made relatively low compared to the resistance of the direct coupled feedback path, capacitor C6 can be dispensed with and the series connection of R11 and R12 replaced by a single resistor. Alternatively, one could dispense with this feedback connection and replace C5 with a direct connection to provide overall direct coupled feedback to the amplifier.

Figure 6:
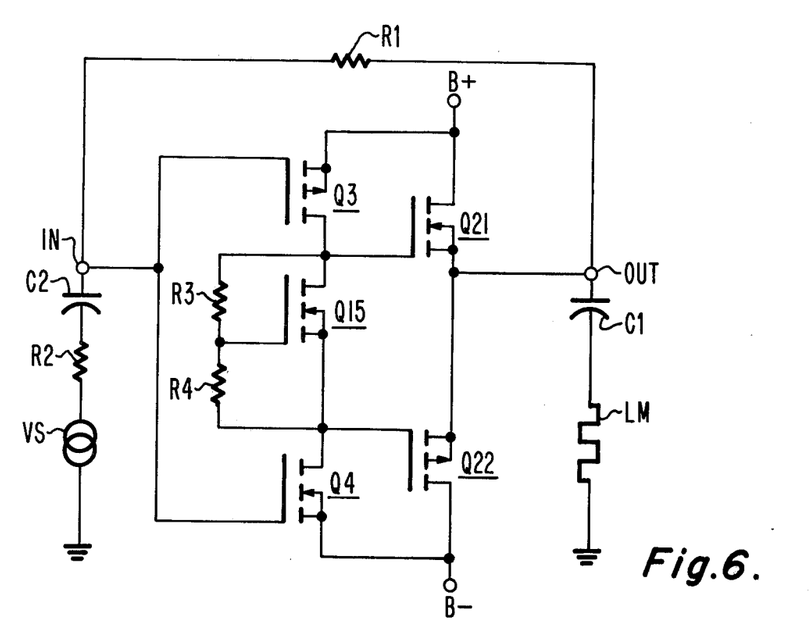

FIG. 6 shows another amplifier embodying the present invention, differing from the foregoing amplifiers in that the amplifier devices in the output stage are enhancement-mode field effect transistors Q21 and Q22 of n-channel and p-channel types, respectively. Q21 and Q22 are conditioned for Class AB operation by direct current conductive means connecting the drain electrodes of Q3 and Q4 and limiting the offset potential between the gate electrodes of Q21 and Q22 just sufficiently to prevent their simultaneously being in heavy conduction.

The direct current conductive means shown in FIG. 6 is analogous to that comprising R3, R4, Q5 in FIG. 3 except that an enhancement-mode field effect transistor Q15, shown as an enhancement-mode type, replaces bipolar transistor Q5, so that an offset potential is produced, reflective of the threshold of conduction in the enhancement-mode output transistors Q21 and Q22 rather than the bipolar transistors. By arranging Q15 to be responsive to the same temperature as Q21 and Q22 the idling current flow through the channels of Q21 and Q22 will be compensated against temperature-dependent variation. Alternatively, the direct current conduction means might be of a type retaining Q5 but reapportioning $R_3$ and $R_4$ or might be of a type comprising a plurality of serially connected diodes poled as forward conduction, since the lower transconductances of FET output devices reduce the need for accurately temperature-compensating them.

Figure 7:
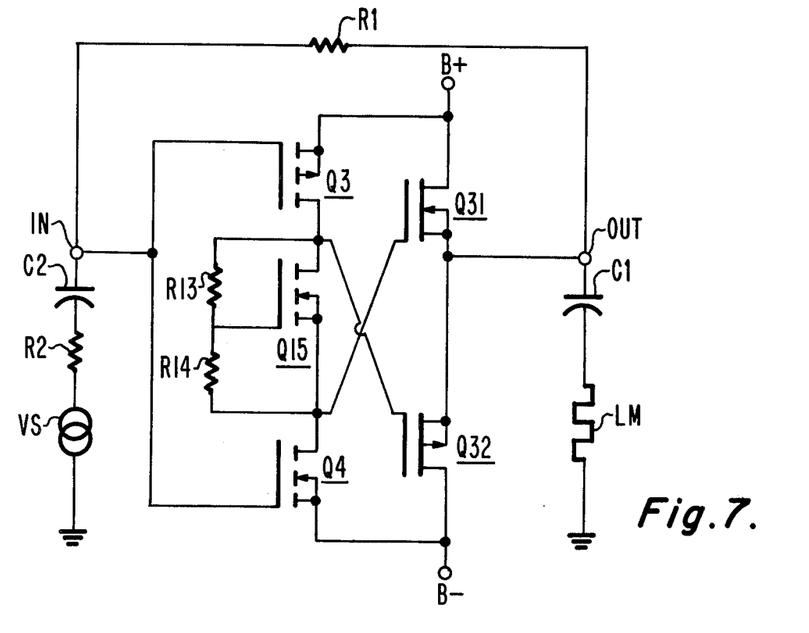

FIG. 7 shows how the amplifier of FIG. 6 can be modified to replace enhancement-mode field-effect transistors Q21 and Q22 with field-effect transistors Q31 and Q32, respectively, which are depletion-mode types with threshold voltages that condition them for remote cut-off. Class AB operation is maintained by connecting the drain electrodes of Q3 and Q4 to the gate electrodes of the p-channel and n-channel output transistors, respectively, via the direct current conductive means comprising R3, R4, Q15—rather than directly as in the FIG. 5 amplifier. Of interest is the fact that the source-to-gate potential of an enhancement-mode FET 15, responsive to the same temperature as Q31 and Q32, can be used to provide temperature-compensated potential between the gates of these depletion-mode FET's Q31 and Q32 to keep the idling currents through their channels more constant with temperature variation. The use of depletion-mode output devices, such as the insulated gate types as particularly shown in FIGS. 5 and 7 or such as junction isolated gate types, is advantageous in that they can pull the terminal OUT to B+ or B− potential without need for the driver circuitry to swing over so large a signal range. This is advantageous inasmuch as the high gate impedance of FET output devices makes it difficult to carry out bootstrapping of the source potentials of Q3 and Q4 in a manner analogous to that taught with respect to bipolar output devices.

The centering of the quiescent output potential at terminal OUT between the B+ and B− operating potential in the amplifiers described will depend upon how well the complementary $I_{DS}$ versus $V_{GS}$ characteristics of Q3 and Q4 can be matched in magnitude. Modern CMOS (complementary metal-oxide-semiconductor) transistor integrated construction techniques make use of ion implantation in forming the transistors. With such construction the output voltage of an inverted pair, such as formed by Q3, Q4 in the FIG. 1 and FIG. 5 amplifiers, will be no further from ground potential than 10% of the value of the operating voltages B+ and B−. This maintains better centering of quiescent output potential than most prior art amplifier designs in which no resort to adjustment of quiescent output potential is made.

One can modify the amplifiers shown to make an adjustment of quiescent output potential in many ways, some of which are suggested following, by way of illustration. One may connect terminal IN of any of the amplifiers shown in FIGS. 1–7 to the slider connection of a potentiometer with its ends connected to B+ and B− operating potentials, respectively, for supplying an adjustable direct current of either polarity to terminal IN, for example. Or such an arrangement may be used to adjust potential at a point in the direct coupling means linking the drain electrodes of Q3 and Q4. In the FIGS. 3 and 4 amplifiers R6 and R8 may be adjustable-resistance resistors ganged so the one increases in resistance while the other decreases, and vice versa. In the FIG. 4 amplifier resistors R9 and R10 may be provided by a potentiometer having its slider connection at terminal N1 and its end connections to the drain electrodes of Q3 and Q4, respectively. In various schemes for adjusting the quiescent output potential at terminal OUT, one may wish to connect a resistor from this terminal to ground to provide a path for conducting away any difference in the quiescent output currents of the output stage transistors.

What I claim is:
1. An amplifier comprising:
   a p-channel field effect transistor and an n-channel field effect transistor, each having respective gate and source and drain electrodes and having a complementary drain current versus source-to-gate potential characteristic to that of the other;
   an input signal terminal at the interconnected gate electrodes of said p-channel and n-channel field effect transistors;
   means applying relatively positive and relatively negative operating potentials to the source electrode of said p-channel field effect transistor and to the source electrode of said n-channel field effect transistor, respectively;

means for applying a biasing potential to said input signal terminal, which biasing potential is substantially midway between said relatively positive and relatively negative operating potentials, which includes means for direct coupling each of the drain electrodes of said p-channel and n-channel field effect transistors to said input signal terminal;

first and second output transistor means of complementary conductivity types to said p-channel field effect transistor and to said n-channel field effect transistor, respectively, each having input and output and common electrodes;

means connecting the drain electrode of said p-channel field effect transistor to the input electrode of said first output transistor means applying the drain potential of said p-channel field effect transistor to the input electrode of said first output transistor means;

means connecting the drain electrode of said n-channel field effect transistor to the input electrode of said second output transistor means for applying the drain potential of said n-channel field effect transistor to the input electrode of said second output transistor means;

means connected between the input electrodes of said first and second output transistor means for biasing them so that said first output transistor means is non-conductive during substantial negative excursions of output signal and so that said second output transistor means is non-conductive during substantial positive excursions of output signal;

means for applying relatively positive and relatively negative operating potentials to the output electrode of said first output transistor means and to the output electrode of said second output transistor means, respectively; and an output signal terminal between the common electrodes of said first and second output transistors means, respectively.

2. An amplifier as set forth in claim 1 wherein said means for direct coupling each of the drain electrodes of said p-channel and n-channel field effect transistors to said input terminal is exclusive of said first and second output transistor means and includes means for decoupling signal variations at the drain electrodes of said p-channel and n-channel field effect transistors from said input terminal.

3. An amplifier as set forth in claim 1 wherein said means for direct coupling each of the drain electrodes of said p-channel and n-channel field effect transistors to said input terminal includes, in addition to said first and second output transistor means, means for direct coupling said output signal terminal to said input signal terminal.

4. An amplifier as set forth in claim 1 wherein said means connected between the input electrodes of said first and second output transistor means essentially consists of means for biasing said first and second output transistor means for Class B operation, which means includes:

a potential divider having an input circuit between the input electrodes of said first and second output transistor means and having an output connection at which a potential intermediate to those at the input electrodes of said first and second output transistor means is provided, and a further transistor having an input electrode to which the output connection of said potential divider connects and having output and common electrodes connected to separate respective ones of the input electrodes of said first and second output transistor means.

5. An amplifier as set forth in claim 1 wherein said means connected between the input electrodes of said first and second output transistor means is a direct connection without substantial intervening impedance between those input electrodes.

6. An amplifier as set forth in claim 1 wherein the source electrode of said p-channel field effect transistor and the output electrode of said first output transistor means are connected together to receive similar-valued relatively positive operating potentials, and wherein the source electrode of said n-channel field effect transistor and the output electrode of said second output transistor means are connected together to receive similar-valued relatively negative operating potentials.

7. An amplifier as set forth in claim 1 wherein said means for applying relatively positive and relatively negative operating potentials to the source electrode of said p-channel field effect transistor and to the source electrode of said n-channel field effect transistor, respectively, includes:

first potential dividing means dividing the potential between the common and output electrodes of said first output transistor means for application to the source electrode of said p-channel field effect transistor; and second potential dividing means dividing the potential between the common and output electrodes of said second output transistor means for application to the source electrode of said n-channel field effect transistor.

8. An amplifier as set forth in claim 1 wherein said means for applying relatively positive and relatively negative operating potentials to the source electrode of said p-channel field effect transistor and to the source electrode of said n-channel field effect transistor, respectively, includes:

first and second resistances included in connections of the source electrode of said p-channel field effect transistor to the common electrode of said first output transistor means and to its output electrode, respectively; and third and fourth resistances included in connections of the source electrode of said n-channel field effect transistor to the common electrode of said second output transistor means and to its output electrode, respectively.

9. An amplifier as set forth in claim 8 wherein said means for applying relatively positive and relatively negative operating potentials to the source electrode of said p-channel field effect transistor and to the source electrode of said n-channel field effect transistor, respectively, includes:

a first bootstrap capacitor connected between said output signal terminal and the source electrode of said p-channel field effect transistor; and a second bootstrap capacitor connected between said output signal terminal and the source electrode of said n-channel field effect transistor.

10. An amplifier as set forth in claim 1 wherein said means for applying relatively positive and relatively negative operating potentials to the source electrode of said p-channel field effect transistor and to the source electrode of said n-channel field effect transistor, respectively, includes:
- a first bootstrap capacitor connected between said output signal terminal and the source electrode of said p-channel field effect transistor;
- a second bootstrap capacitor connected between said output signal terminal and the source electrode of said n-channel field effect transistor; and wherein the
- means supplying relatively positive and relatively negative operating potentials to the source electrode of said p-channel field effect transistor and to the source electrode of said n-channel field effect transistor are, of a type for permitting said first boostrap capacitor to boost the source potential of said p-channel transistor during positive excursions of output signal at said output signal terminal and permitting said second bootstrap capacitor to boost the source potential of said n-channel transistor during negative excursions of output signal at said output signal terminal.

11. An amplifier as set forth in claim 1, 2, 3, 4, 5, 6, 7, 8, 9 or 10 wherein said first output transistor is an NPN bipolar transistor and said second output transistor is a PNP bipolar transistor, each of these bipolar transistors having base and collector and emitter electrodes corresponding to their said input and output and common electrodes, respectively.

12. An amplifier as set forth in claim 1 wherein said first output transistor is an NPN bipolar transistor and said second output transistor is a PNP bipolar transistor, each of these bipolar transistors having base and collector and emitter electrodes corresponding to their said input and output and common electrodes, respectively, and wherein the channel resistances of said p-channel and n-channel field effect transistors are chosen to maintain said NPN and PNP transistors within their safe operating area ratings when said output terminal is short-circuited.

13. An amplifier as set forth in claim 1 wherein said first and said second output transistor means are field effect transistors, each having respective gate and drain and source electrodes corresponding to its input and output and common electrodes, respectively.

14. An amplifier as set forth in claim 13 wherein said means connected between the input electrodes of said first and second output transistor means is a direct connection without substantial intervening impedance between those input electrodes and wherein said first and second output transistor means are depletion-mode field effect transistors conditioned by said direct connection for Class AB push-pull operation.

15. An amplifier as set forth in claim 14 wherein said means for direct coupling each of the drain electrodes of said p-channel and n-channel field effect transistors to said input terminal includes resistance means connecting said direct connection between the input electrodes of said first and second output transistor means to said input signal terminal.

16. An amplifier as set forth in claim 15 wherein said resistance means includes a pair of resistive elements serially connected between said input signal terminal and said direct connection between the input electrodes of said first and second output transistor means and wherein a by-pass capacitor connects an interconnection between those resistive elements to a point of fixed potential.

17. An amplifier as set forth in claim 13 wherein said first and second output transistor means are enhancement-mode field effect transistors and wherein the means connected between the input electrodes of said first and second output transistor means is exclusive of said means for connecting the drain electrode of said p-channel transistor to the input electrode of said first output transistor means, is exclusive of said means for connecting the drain electrode of said n-channel transistor to the input electrode of said second output transistor means, and includes:
- a further field effect transistor having a source electrode connected to the drain electrode of the one of said p-channel and n-channel field effect transistors of similar conductivity type to said further field effect transistor, having a drain electrode connected to the drain electrode of the one of said p-channel and said n-channel field effect transistors of complementary conductivity type to said further field effect transistor, and having a gate electrode; and
- potential divider means dividing the potential between the source and drain electrodes of said further transistor for application to its gate electrode.

18. An amplifier as set forth in claim 13 wherein said first and second output transistor means are depletion-mode field effect transistors and wherein the means connected between the input electrodes of said first and second output transistor means is included in said means connecting the drain electrode of said p-channel field effect transistor to the input electrode of said first output transistor means, is included in said means connecting the drain electrode of said n-channel field effect transistor to the input electrode of said second output transistor means, and includes:
- a further field effect transistor having a source electrode connected to the drain electrode of the one of said p-channel and said n-channel field effect transistors of the same conductivity type as said further field effect transistor, having a drain electrode connected to the drain electrode of the one of said p-channel and said n-channel field effect transistors of complementary conductivity type to said further field effect transistor, and having a gate electrode; and
- potential divider means dividing the potential between the source and drain electrodes of said further transistor for application to its gate electrode.

19. An amplifier as set forth in claim 13, 17 or 18 having a direct-coupled feedback connection between said signal output terminal and said signal input terminal, included in said means for direct coupling each of the drain electrodes of said p-channel and n-channel field effect transistors to said input terminal.

20. An amplifier as set forth in claim 13 wherein said means for direct coupling each of the drain electrodes of said p-channel and n-channel field effect transistors to said input terminal includes:
- means for providing similar direct-coupled feedback between the drains of said p-channel and n-channel field effect transistors and their gate electrodes.

21. An amplifier as set forth in claim 13 having:
- means, exclusive of said first and second output transistor means, for providing similar direct-coupled feedback between the drains of said p-channel and n-channel field effect transistors and their gate electrodes.

22. A Class AB push-pull amplifier comprising:

a p-channel field effect transistor and an n-channel field effect transistor of depletion-mode type, each having respective gate and source and drain electrodes and having a complementary conductivity characteristic to that of the other;

means for applying relatively positive and relatively negative operating potentials to the drain electrodes of said n-channel and said p-channel field effect transistors, respectively;

a further field effect transistor of enhancement-mode type having a source electrode connected to the gate electrode of the one of said depletion-mode field effect transistors of similar conductivity type to itself, having a drain electrode connected to the gate electrode of the one of said depletion-mode field effect transistors of opposite conductivity type to itself, and having a gate electrode;

potential divider means for applying a fraction of the potential between the source and drain electrodes of said further field effect transistor between its source and gate electrodes;

a current source means connected to the gate electrode of said n-channel field effect transistor of depletion-mode type, and a current sink means connected to the gate electrode of sad p-channel field effect transistor of depletion-mode type, at least one of said current source means and said current sink means arranged to conduct current varying in accordance with an input signal; and an output signal terminal to which the source electrodes of said p-channel and n-channel field effect transistors respectively connect.

23. A Class AB push-pull amplifier as set forth in claim 22 wherein said current source means comprises another p-channel field effect transistor having a gate electrode to which said input signal is applied, having a drain electrode connected to the gate electrode of said p-channel field effect transistor, and having a source electrode; wherein said current sink means comprises another n-channel field effect transistor having a gate electrode to which said input signal is applied, having a drain electrode connected to the gate electrode of said n-channel field effect transistor, and having a source electrode; and wherein relatively positive and relatively negativing operating potentials are applied to the source electrode of said p-channel transistor and to the source electrode of said n-channel transistor.

* * * * *